United States Patent
Hollmer et al.

(10) Patent No.: US 6,201,737 B1
(45) Date of Patent: Mar. 13, 2001

(54) APPARATUS AND METHOD TO CHARACTERIZE THE THRESHOLD DISTRIBUTION IN AN NROM VIRTUAL GROUND ARRAY

(75) Inventors: Shane Hollmer, San Jose; Kazuhiro Kurihara, Sunnyvale, both of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/558,764

(22) Filed: Apr. 26, 2000

Related U.S. Application Data
(60) Provisional application No. 60/178,603, filed on Jan. 28, 2000.

(51) Int. Cl.[7] .................................................. G11C 16/00
(52) U.S. Cl. .............................. 365/185.16; 365/185.09; 365/185.23; 365/185.24
(58) Field of Search .......................... 365/185.16, 185.17, 365/185.23, 185.09, 185.24

(56) References Cited

U.S. PATENT DOCUMENTS

| | | | |
|---|---|---|---|
| 4,173,766 | 11/1979 | Hayes | 257/315 |
| 4,253,059 | * 2/1981 | Bell et al. | 365/185.23 |
| 4,779,272 | * 10/1988 | Kohda et al. | 365/185.09 |
| 5,280,446 | 1/1994 | Ma et al. | 365/185.15 |
| 5,349,221 | 9/1994 | Shimoji | 257/324 |
| 5,576,991 | * 11/1996 | Radjy et al. | 365/185.24 |
| 5,761,125 | * 6/1998 | Himeno | 365/185.24 |
| 5,768,192 | 6/1998 | Eitan | 365/185.24 |
| 5,825,686 | 10/1998 | Schmitt-Landsiedel et al. | 365/185.03 |
| 5,828,604 | * 10/1998 | Kawai et al. | 365/185.24 |
| 5,847,998 | 12/1998 | Van Buskirk | 365/185.33 |
| 5,867,430 | 2/1999 | Chen et al. | 365/185.04 |
| 5,956,330 | * 10/1999 | Tang et al. | 365/185.09 |
| 6,031,763 | * 2/2000 | Sangbury | 365/185.24 |

FOREIGN PATENT DOCUMENTS

| | | |
|---|---|---|
| 2 157 489 | 10/1985 | (GB). |
| WO 99/07000 | 2/1999 | (WO). |

* cited by examiner

*Primary Examiner*—Tan T. Nguyen
(74) *Attorney, Agent, or Firm*—Brinks Hofer Gilson & Lione (57) ABSTRACT

A virtual ground array based flash memory device includes a virtual ground array containing individual memory elements with supporting input/output circuitry. Variations occur in the threshold voltage of memory elements contained in the virtual ground array caused by excessive usage of the memory elements. Characterization of the variation of threshold voltage as a function of usage as well as the distribution of the various threshold voltages is important for diagnostic purposes. External sources of voltage and means of determination are necessary to characterize the threshold voltages and the I–V characteristics, when the virtual ground array is in a diagnostic mode. In this mode, the drains, sources, and gates of selected memory elements in the virtual ground array may be under independent external control. The current from the source of the selected memory element is determined in response to the externally controlled voltages, thereby creating an I–V curve. Operational elements contained in input/output multiplexors to the virtual ground array pass externally controlled near ground voltages to the selected memory element. The present arrangement and method of characterizing selected memory elements in the virtual ground array using the source side of the memory elements saves time, conserves power, and is a useful diagnostic tool.

34 Claims, 4 Drawing Sheets

APPARATUS AND METHOD TO CHARACTERIZE THE THRESHOLD DISTRIBUTION IN AN NROM VIRTUAL GROUND ARRAY

RELATED APPLICATION

This application is based on Provisional Application Serial No. 60/178,603 filed Jan. 28, 2000, which is incorporated herein by reference.

FIELD OF THE INVENTION

The present invention relates to the field of flash memory devices. More particularly, the invention relates to a mechanism and method to characterize the threshold distribution in an NROM virtual ground array.

BACKGROUND OF THE INVENTION

The overall array architecture for a typical virtual ground array based flash memory device includes a virtual ground array accessed by a set of row decoders/multiplexors and a set of column decoders/multiplexors. The virtual ground array contains information stored in individual memory elements. The row decoders/multiplexors are used to access specific memory elements within each memory block and the column decoder/multiplexor provides the input and output circuitry for each memory element.

The architecture of a virtual ground array comprises both individual memory elements and select gates. The memory elements are embodied in non-volatile transistors that may be programmed to a logic state of 0, 1, or other states depending on the particular type of transistor and programming used. The select gates are embodied in normal MOSFETs. Selectable word lines address both the control gates of the transistors that comprise the individual memory elements and select gates in the virtual ground array. Sets of memory elements are connected in series along each word line. The select gates are connected in pairs that are coupled to alternate select gate address lines. The pairs of select gates are connected with pairs of memory elements and a global bitline. A set of multiplexors control the columns that are connected to the external circuitry, such as the sensing circuitry and data-in path. The multiplexors are controlled by a set of column address decoders. Thus, the decoders and multiplexors regulate the flow of data into and out of the virtual ground array.

Variations of the threshold voltage of the individual memory elements within the virtual memory array occur as a result of variations in the manufacture, continual operation over time and as a result of operating conditions of the memory device. Because of these variations in the threshold voltage, it is necessary to characterize the distribution and placement of the threshold voltages for both reasons of functionality and reliability.

A safe and accurate sensing scheme uses sensing from the source side of the virtual ground array. Sensing is accomplished from the source side as using the drain side of the virtual ground array has a number of disadvantages. The main disadvantage of drain side sensing is that all the other bitlines connected with memory elements not being sensed must be precharged to the drain voltage or higher before the sensing routine commences. Precharging the bitlines, in this case, uses both time and power. Time is necessary to initiate, perform, and verify the precharging sequence when sensing from the drain side. Excess power is consumed in each of the precharge steps as well, for example decreasing battery lifetime for any portable electronics unit using the virtual ground array. In addition, sensing from the drain side leads to larger leakage currents and more thus error. Thus, it is necessary to characterize the threshold distribution of memory elements using the source side to determine the optimal operating conditions.

BRIEF SUMMARY OF THE INVENTION

In view of the above, a mechanism and method of characterizing the distribution and placement of threshold voltages for individual flash memory elements in a virtual ground array is provided.

A first aspect of the present invention is directed to a method for characterizing non-volatile memory elements in a virtual ground array from the source side. The method comprises selecting a set of memory elements contained in the virtual ground array. External control exists for at least one voltage input to at least the gate, drain, or source of at least one selected memory element in the set of selected memory elements. The current from the source of the selected memory element is determined.

An aspect of the present invention includes determining the current at the source of the selected memory element. The determination may comprise changing the voltage applied to the gate of the selected memory element incrementally toward a predetermined voltage while holding the voltage applied to the drain constant or changing the voltage applied to the drain incrementally while holding the voltage applied to the gate constant. In addition, both the gate and drain voltages may be changed simultaneously. The voltages may be changed until predetermined voltages are applied or the memory element is otherwise fully characterized. The method includes providing at least one operational element adapted to pass externally controlled near ground voltages to the selected memory element. The method may be repeated until all of the memory elements in a set of selected memory elements have been characterized.

A second aspect of the present invention is directed towards an apparatus for characterizing non-volatile memory elements in a virtual ground array from the source side. The apparatus comprises a virtual ground array containing memory elements, at least one source multiplexor, at least one word line multiplexor, and at least one drain multiplexor. Each of the memory elements contained in the virtual ground array is selectable by a gate, source, and drain. The gate of the memory element is selectable by a word line of a plurality of word lines, the source is selectable by a first bitline of a plurality of bitlines, and the drain is selectable by a second bitline of the plurality of bitlines.

Each source multiplexor is operatively connected with the source of a selected memory element contained in the virtual ground array through another multiplexor. The source multiplexor multiplexes the source to either internal sense circuitry or an I/O pad. The I/O pad is in communication with external sense circuitry. Each drain multiplexor is operatively connected with the drain of a selected memory element contained in the virtual ground array through another multiplexor. The drain multiplexor multiplexes the drain to either an internal drain voltage generator or an external drain controller. Each word line multiplexor is operatively connected with the gate of a selected memory element contained in the virtual ground array through a decoder. The word line multiplexor multiplexes the gate to either an internal gate voltage generator or an external gate controller. The drain, source, and the gate of a selected memory element may be externally controlled and the current from the selected memory element is determined. At least one operational element is adapted to pass externally controlled near ground voltages to the selected memory element.

The apparatus may further comprise an external gate controller operative to apply a gate voltage to the gate of the selected memory element and an external drain controller operative to control either the drain voltage. The gate voltage can be incrementally changed toward a predetermined voltage and the drain voltage held constant. Alternatively, the drain voltage can be incrementally changed toward a predetermined voltage and the gate voltage held constant or any combination thereof. In any case, the current from the source of the selected memory element is determined after each incremental change. The voltages may be changed until predetermined voltages are applied or the memory element is otherwise fully characterized. The characterization continues until the characteristics of all of a predetermined set of memory elements in the virtual ground array have been determined.

The apparatus further comprises select gates, selectable by select gate lines, local bitlines formed by a diffusion process and connecting the select gates with the memory elements, and global bitlines composed of metal and connecting the select gates with elements external to the virtual ground array. The memory elements are selectable by word lines and at least two of the select gates.

It is therefore a primary advantage of the present invention to increase the reliability and functionality of the non-volatile memory elements contained in a virtual ground array by characterizing the distribution and placement of at least a portion of the threshold voltages of the memory elements.

The following figures and detailed description of the preferred embodiments will more clearly demonstrate these and other objects and advantages of the invention.

DETAILED DESCRIPTION OF THE PRESENTLY PREFERRED EMBODIMENTS OF THE INVENTION

Figure 1A:
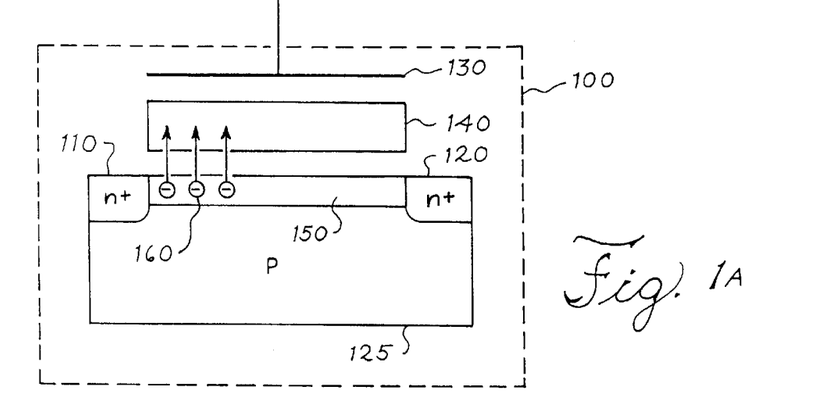
FIG. 1A depicts an individual memory element during a program operation.
Figure 1B:
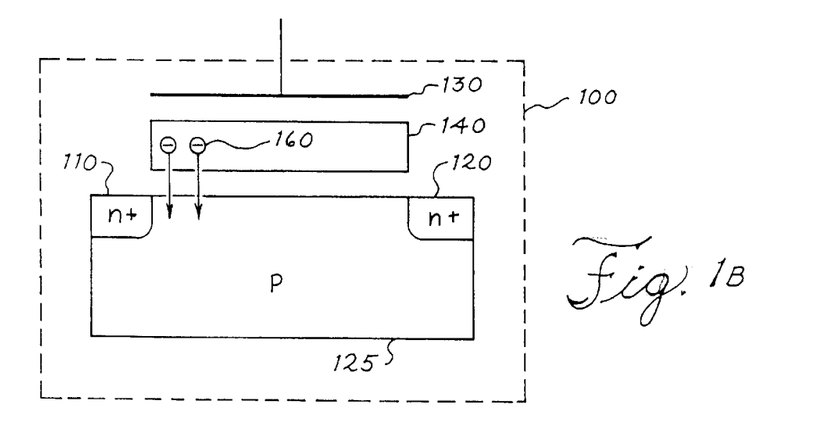
FIG. 1B depicts an individual memory element during an erase operation.
Figure 1C:
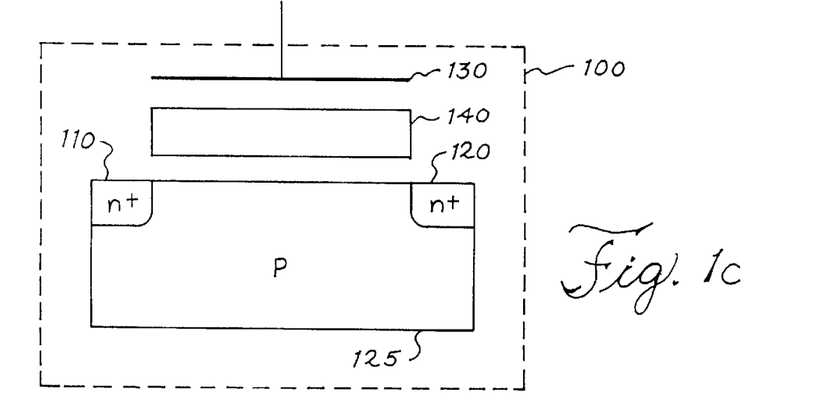
FIG. 1C depicts an individual memory element during a read operation.

The arrangement of the present invention includes essential non-volatile memory elements. Individual memory elements can undergo three distinct operations, which are shown in FIGS. 1A, 1B and 1C. The three operations are Program, shown in FIG. 1A, Erase, shown in FIG. 1B, and Read, shown in FIG. 1C, and are described below. The following discussions will be limited to n-channel nitride-based non-volatile memory elements. Those ordinarily skilled in the art will appreciate that the basic operations described herein can be applied to a number of non-volatile memory elements, such as standard floating gate technology or multi-bit/cell non-volatile memory elements in which four states can be programmed. Multi-bit/cell memory elements may be fabricated with an oxide-nitride-oxide (ONO) layer sandwich instead of a poly floating gate layer.

The structure of the memory element 100 is well known in the art: a set of n-type semiconductor junctions comprising the source 110 and drain 120 are disposed within a p-type semiconductor well 125. The memory element 100 further includes a control gate 130 and a floating gate 140. The gates 130, 140 are conventionally formed from polysilicon deposited and patterned on the surface of the substrate, although the floating gate 140 may alternately be formed from a nitride layer. The gates 130, 140 are formed such that an oxide is formed on part of the substrate with the floating gate 140 formed above the oxide. The control gate 130 is formed above the floating gate 140 and isolated from the floating gate 140 by a second oxide. Control signals are applied to the control gate 130.

During the program operation, as shown in FIG. 1A, the drain 120 is connected with Vss (usually ground) while the source 110 of the memory element 100 is connected with a large voltage, usually >4V. The threshold voltage of the MOSFET may either be a positive or negative voltage which, when exceeded, causes a channel 150 of electrons 160 to exist in the p-type semiconductor well 125. For the case of a negative threshold voltage, the channel 150 exists when the gate 130 is set to Vss in an erased state. The channel 150 is disposed between the source 110 and drain 120 of the memory element 100. A large positive voltage is applied to the control gate 130, which causes electrons 160 to be trapped onto the nitride layer 140 via hot electron injection. The threshold voltage of the transistor is increased if electrons are trapped on the nitride layer 140. The electrons trapped on the nitride layer are usually trapped and immobilized near the source of the electrons, unlike standard floating gate technology, in which a nitride layer is not used and the trapped electrons are mobile along the floating gate.

During the erase operation, as shown in FIG. 1B, the source 110 and the drain 120 of the memory element 100 are set to a moderate voltage, usually 5–6V, while the control gate 130 is set to a moderate negative voltage, usually –5V. As a consequence, the electrons 160 trapped on the floating gate 140 enter the p-type semiconductor well 125 via Fowler-Nordheim tunneling. The threshold voltage thus ideally reverts to the original, unprogrammed threshold voltage of the transistor. Normally, a number of memory elements in a block (for example, the entire virtual ground array or only a sector of, say 512K) will be erased at the same time.

During the read operation, as shown in FIG. 1C, the source 110 of the memory element 100 is connected with Vss, which may be supplied by a bitline, while the drain is connected with a different bitline. The voltage applied to the control gate 130 of the memory element 100 is between the threshold voltage of memory elements that have been erased and memory elements that have been programmed. In one method, a moderate voltage sufficient to turn both an erased and programmed memory element on (say 4V), may be applied to the control gate 130 during a verification or read operation. The current flowing from an erased memory element will be greater than that flowing from a programmed memory element. The current flowing from the memory element 100 may thus be compared to a reference current (which may be set anywhere between that of an erased and programmed memory element). Another method entails, for threshold voltages of erased and programmed memory element of 1V and 3V respectively, applying an intermediate bias of 2V to the control gate 130. In this case, the memory element 100 will be either on or off depending on whether erased or programmed.

As mentioned in the background, the threshold voltage of a memory element changes over usage. This is because of charge trapping in the nitride layer or the intermediate oxide. As described above, during programming electrons, are locally trapped in the nitride near the source of the electrons via hot-electron injection. During erasure, these electrons are ejected from the nitride usually via Fowler-Nordheim tunneling. However, over numerous programming cycles, some of the electrons move toward the center of the nitride and remain trapped after the completion of the erase cycle. Usually, the number of electrons that remain trapped increases gradually, leading to a small but progressive increase in the threshold voltage. In addition to altering the threshold voltage, the current associated with a memory element being read decreases as well. Eventually, after many programming cycles the threshold voltage increases and current decreases enough to cause errors during verification modes of the memory element.

Figure 2:
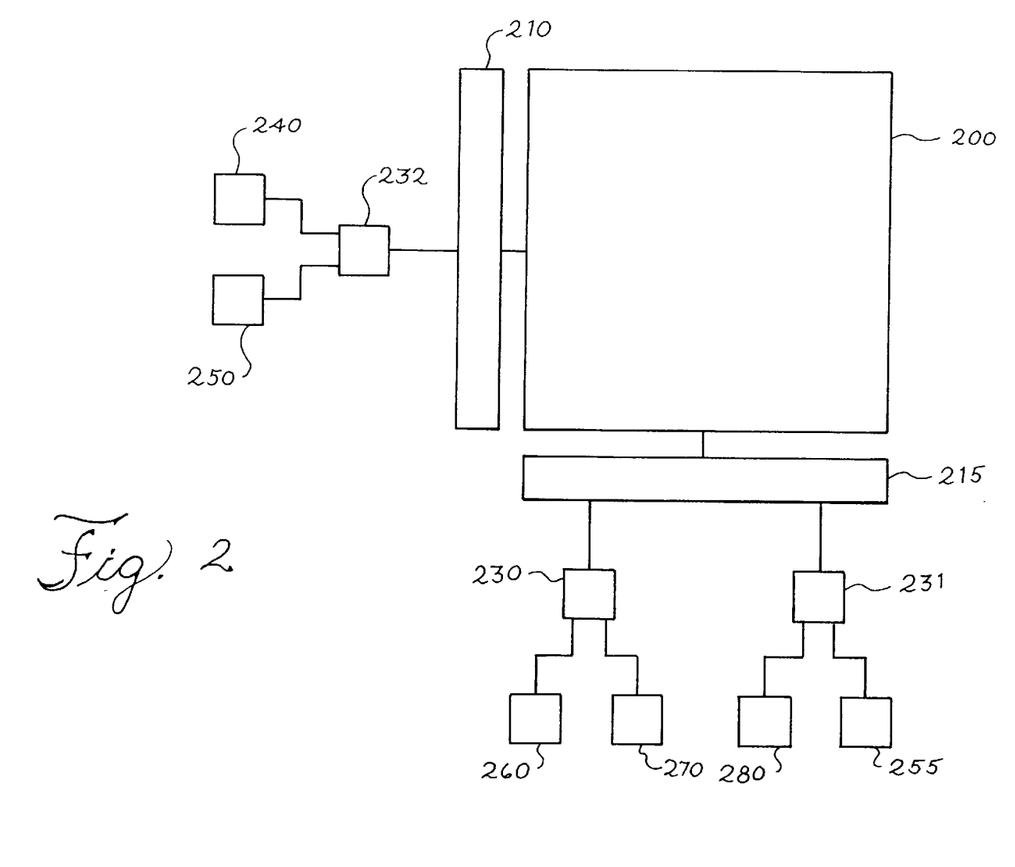
FIG. 2 shows the overall architecture of the characterization arrangement according to the invention.

The overall system architecture associated with the virtual ground array is shown in FIG. 2. Both a word line decoder 210 and a y-multiplexor 215 are used to address the virtual ground array 200. The word line decoder 210 is used to apply voltages to the gates of particular memory elements contained in the virtual ground array. The y-multiplexor 215 is used to select the sources and drains of a different set of memory elements contained in the virtual ground array. The y-multiplexor 215 is optimized to be able to pass a wide range of voltages, from Vss to the supply voltage, to enable more flexible characterization. This allows the user to characterize the memory element when operating in either the linear mode or the saturated mode as desired.

During the characterization mode, the routing multiplexor 230 is used to route the current of the selected memory element through the y-multiplexor 215 to the I/O pad 260 to external elements (not shown) to determine the threshold voltage, source current. During normal operational modes, i.e. erasing, programming, or reading the memory elements, the routing multiplexor 230 routes the characteristic to the sense circuitry 270. In addition, a drain-input multiplexor 231 and gate-input multiplexor 232 allow the voltage applied to the drain and control gate respectively, of the selected memory element to be controlled by either an internally supplied voltage or an externally supplied voltage. During the characterization mode, the drain-input multiplexor 231 selects an externally supplied voltage from an external drain voltage 280 to be applied to the drain, while during the normal operation mode, an internally supplied voltage from an internal drain voltage supplier 255 is selected. Similarly, during the characterization mode, the gate-input multiplexor 232 selects an externally supplied voltage an external gate voltage 240 to be applied to the control gate, while during the normal operation mode, an internally supplied voltage from an internal gate voltage supplier 250 is selected. Thus, during the characterization mode, all three terminal voltages, gate, source, and drain, of a selected memory element may be externally controlled. This is to say that a complete set of I-V curves can be developed for each memory element selected under all operating conditions.

Of course, the y-multiplexor 215 may be split into separate source multiplexors and drain multiplexors and odd/even bitline multiplexors. Similarly, a bank of y-multiplexors containing multiple y-multiplexors (along with additional elements corresponding to those mentioned above) may be used if the virtual ground array has a large number of memory elements or multiple virtual ground arrays are used. If multiple y-multiplexors are used, a y-decoder may be used to decode the particular y-multiplexor desired. In any case, the basic concept remains the same. An additional element, a data buffer may be arranged between the virtual ground array 200 and the I/O pad 260 leading to the necessary external determination circuit. The description of the operation in characterization mode follows after the description of the virtual ground array.

The placement of the ground in the virtual ground array 200, Vss, may be changed to different sets of nodes, unlike a typical NOR architecture in which Vss is dedicated. Of course, Vss can be an arbitrary voltage rather than ground, which alters the other applied voltages necessary for operation. This is to say that one side of a specific set of non-volatile memory elements contained in the virtual ground array may be held at a predetermined potential during an operation performed on that set of memory elements. After the operation finishes, one side of a different set of non-volatile memory elements may be held at a different (or the same) preset potential during the next operation cycle. The virtual ground array contains an array of memory elements arranged along intersecting word lines and bitlines.

Figure 3:
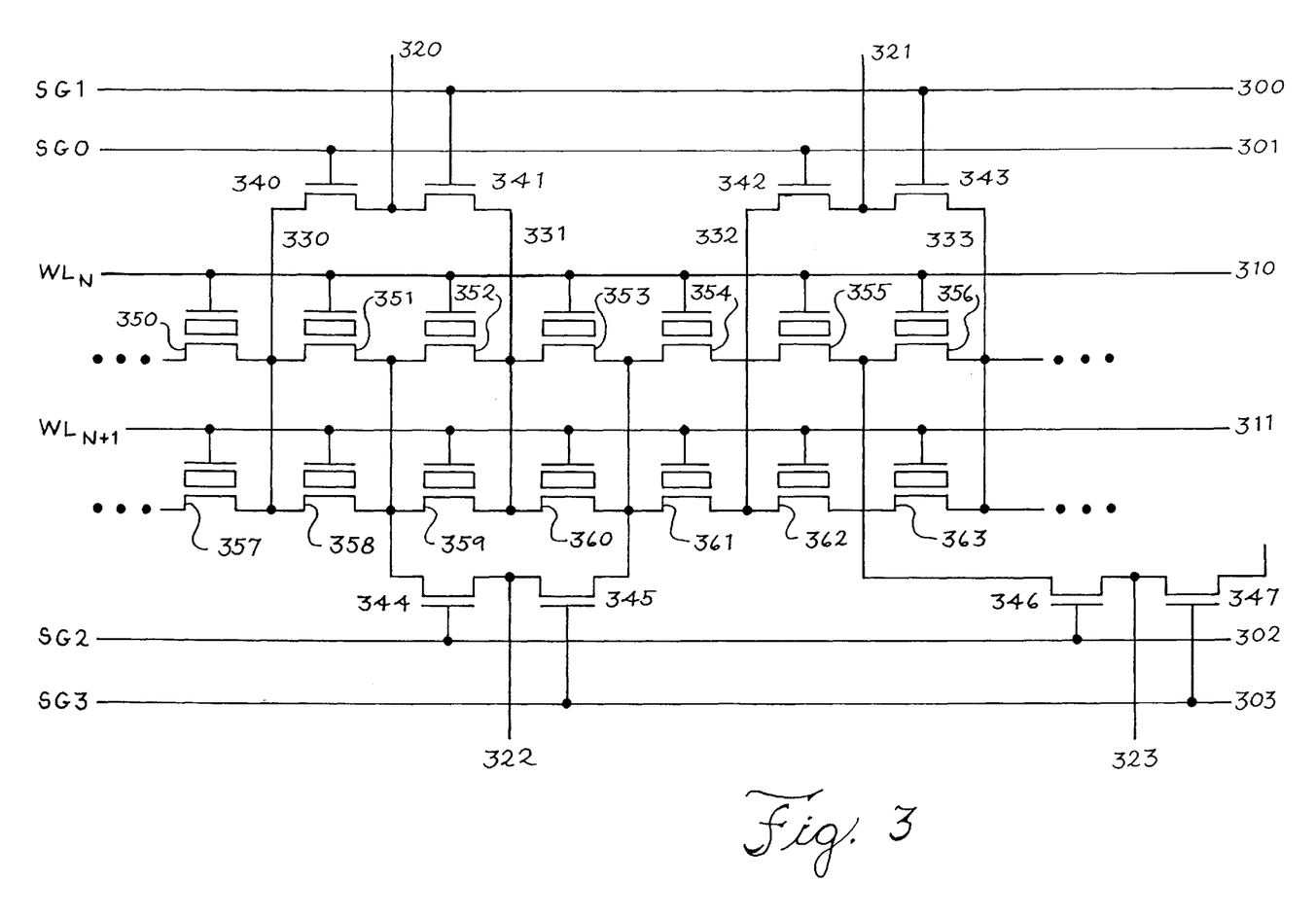
FIG. 3 shows the architecture of a virtual ground array according to the invention.

A section of the architecture of the virtual ground array of the present invention is shown in FIG. 3. The virtual ground array contains memory elements 350–363, select gates 340–347, and lines of communication 300–303, 310–311, 320–323, 330–336 that provide access to the memory elements 350–363 and select gates 340–347. The lines of communication 300–339 are divided up into row lines 300–303, 310–311 and column lines 320–323, 330–336. The row lines consist of word lines 310, 311 that address memory elements 350–363 and select gate lines 300–303 that address the select gates 340–347. The column lines 320–323, 330–336, or bitlines, consist of both global bitlines 320–323, which are connected between the select gates 340–347 and external elements such as the decoders and multiplexors 210, and local bitlines 330–336, which are connected between the select gates 340–347 and the memory elements 350–363.

In the preferred embodiment of the present invention, the global bitlines 320–323 are fabricated using a metal, such as aluminum, gold, or any other metal, alloy, or combination of metals known in the art. The local bitlines 330–336 are fabricated by diffusion of high levels of impurities into the silicon substrate 105 near the location where the memory elements 350–363 and select gates 340–347 are formed. One reason behind using diffusion as local bitlines between memory elements and select gates is that, as die sizes of the overall system architecture shrink and the number of memory elements continues to increase, conservation of real estate on a chip containing the architecture becomes increasingly important. The bitlines formed by diffusion save space as, not only does the virtual ground array not need contacts, but also the local bitlines serve as the source and drain nodes of the virtual ground array. By using diffusion to form local bitlines in the array a small, tight, and contact-less architecture can be fabricated.

As illustrated in FIG. 3, the virtual ground array is arranged such that there are four select gate lines 300–303 and two word lines 310, 311. Usually, the virtual ground array can contain any number of word lines, for example 128 word lines. Each word line has a plurality of memory elements 350–363 arranged in a series such that the source of one memory element 352 is connected with the drain of the next memory element 353. The word lines 310, 311 are connected with the control gate of the memory elements associated with the particular word line. Similarly, the select gate lines 300–303 are connected with the control gates of the select gates 340–347 associated with the particular select gate line.

Pairs of select gates are used to select a particular memory element in order to access the data contained therein. In FIG. 3, the select gate lines are divided into two pairs of select gate lines and the pairs of select gates are connected with one or the other of these pairs of select gate lines. One select gate contained in a pair of select gates is connected with one of the associated pair of select gate lines, while the other select gate contained in the pair is connected with the other select gate line. Each pair of select gates is connected with a set of pairs of memory elements by a pair of local bitlines. Each pair of the set of pairs of memory elements is disposed along a unique word line. The pairs of select gates are connected with the sets of pairs memory elements as follows: pairs of select gates connected with one pair of select gate lines are interleaved with pairs of select gates connected with the other pair of select gate lines.

Thus, as in FIG. 3, a first memory element 351 disposed along a word line 310 is connected between a first and second select gate 340, 344 by a first and second local bitline 330, 334. These select gates 340, 344 are connected with a first and second select gate line 301, 302 contained in two different pairs of select gates. A second memory element 352, adjacent to the first memory element 351, is connected between the second select gate 344 and a third select gate 341. The third select gate 341 is connected with the second memory element 352 by a third bitline 331. The third select gate 341 is connected with the first select gate 340 and a third select gate line 300. The first and third select gates 340, 341 define a first pair of select gates. A third memory element 353 is connected between the third select gate 341 and a fourth select gate 345. The fourth select gate 345 is connected with the third memory element 353 by a fourth bitline 335. The fourth select gate 345 is connected with the second select gate 344 and a fourth select gate line 303. The second and fourth select gates 344, 345 define a second pair of select gates. Thus, the first and second pair of select gates are interleaved along the word line 310.

As mentioned, specific sets of memory elements may be held at different predetermined voltages during different operation cycles. For example, to perform a read on a particular memory element 352, two select gates 341, 344 have voltages sufficient to turn them on supplied to them by two select gate lines 300, 302. One of the global bitlines 322 associated with one of the select gates 302 is held at the supply voltage, consequently setting the voltage at the drain of the memory element 352 being read via the local bitline 334. The word line 310 associated with the memory element 352 supplies the memory element 352 with the read voltage. The data is provided along the local bitline 331 through the select gate 341 to external elements (not shown) via the global bitline 320. Thus, the global bitline 320 contains output data in the form of the amount of sensing current from the selected memory element 352.

As an example, the global bitline associated with the selected memory element is biased to the supply voltage. The select gate voltage is tied to some analog level and the actual drain voltage of the selected memory element is equal to the select gate voltage minus the threshold voltage. Thus, for example, a global bitline connected with the drain of the select gate is set to about 3V. If the voltage applied to the gate of the select gate is about 2½V and the normal threshold voltage of the select gate is about 1V, the drain voltage of the selected memory element is around 1½ volts. The source voltage of the selected memory element is usually close to ground.

The sensing current is selected by the y-multiplexor 215 and the word line decoder 210 of FIG. 2 and subsequently passed to the routing multiplexor 230. Only one valid sensing current per output will exist because only one pair of global bitlines per output is selected, i.e. the other bitlines will float and thus no current path will exist for the other bits. In addition, as mentioned before, a plurality of multiplexors and column decoders are necessary if there is a large number of active global bitlines to decode. Column decoders decode external addresses to produce signals that decode the bitline multiplexor. Thus, for the virtual ground array, the decoders and multiplexor must select two bitlines for every address. As described above, one of the bitlines associated with the address serves as the source and one of the bitlines associated with the address serves as the drain. However, in applications where a byte or word is read at one time, multiple pairs of memory elements may be selected for each address.

Figure 4:
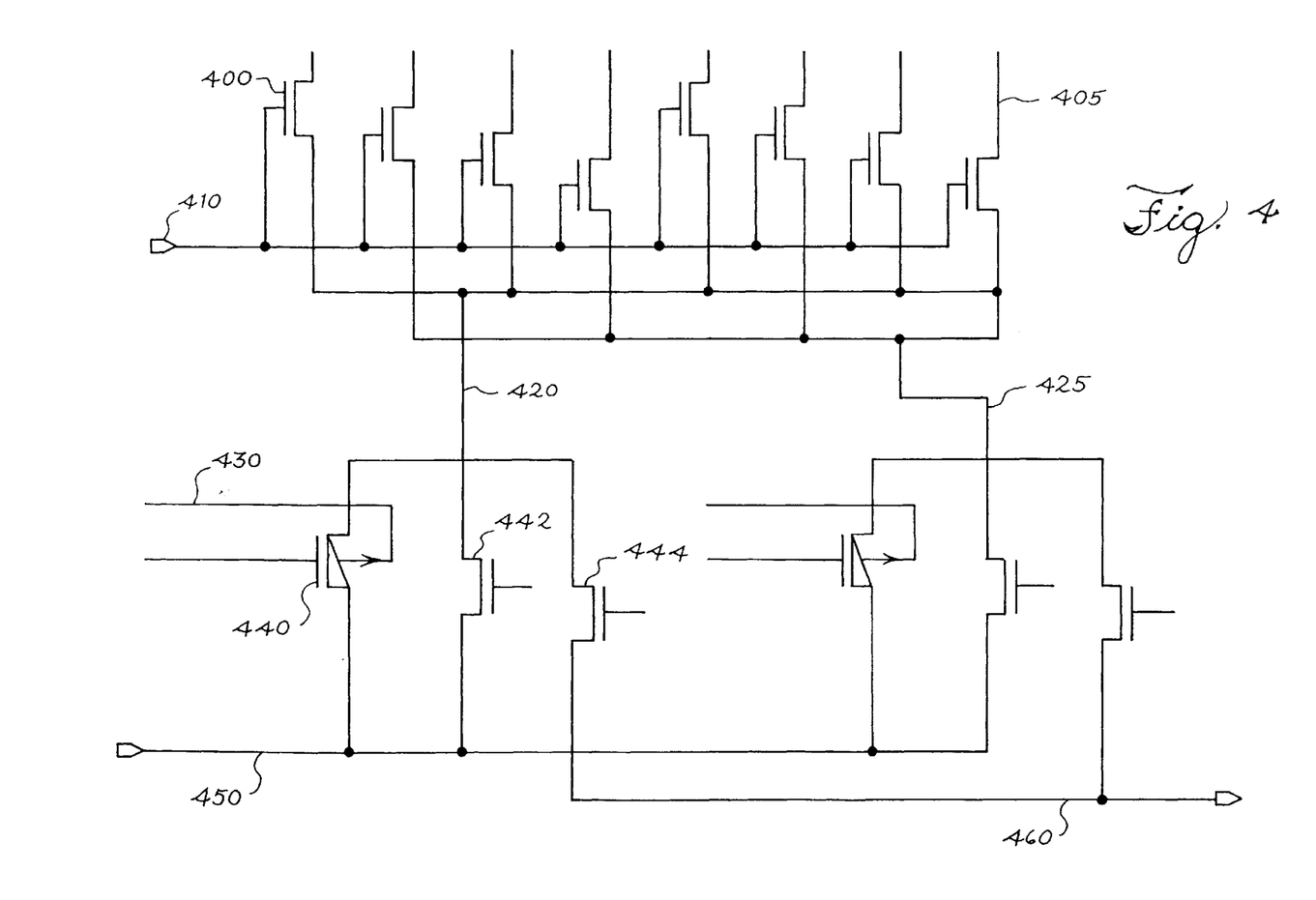
FIG. 4 shows the y-multiplexor architecture according to the invention.

FIG. 4 displays the y-multiplexor 215 according to the present invention. The y-multiplexor 215 comprises switching elements 400, a set of switching element lines 410, global bitlines 405, operating elements 440, 442, 444, an input line 450, and an output line 460. The switching elements 400 are connected with the virtual ground array via global bitlines 405, as described above. The switching elements 400 are also connected with the input line 450 and the output line 460 through the operating elements 440, 442, 444. Usually, as FIG. 4 depicts, the y-multiplexor 215 comprises two sets of operating elements, a set connected with even switching elements via an even bitline 420 and a set connected with odd switching elements via an odd bitline 425. During operation, a separate y-decoder (not shown) selects one of the switching element lines 410 and one of the operating elements 440, 442, 444. The source of a selected memory element in the virtual ground array is connected with the output line 460 via a switching element 400 and the operating elements 440, 442, 444. A separate y-multiplexor controls the connection between the drain of the selected memory element and the input line 450 via the corresponding elements.

Generally, y-multiplexors include both a p-channel operating element 440, for connection of an input with the drain of a selected memory element, and a n-channel operating element 444, for connection of the drain of the selected memory element with an output. However, only using a p-channel operating element 440 incurs a problem in attempting to pass a voltage close to ground during I–V characterization. The problem is alleviated by the addition of the n-channel operating element 442 connected in parallel with the p-channel operating element 440.

As mentioned above, during characterization of the threshold voltages the drain-input multiplexor 231 and gate-input multiplexor 232 select externally controlled voltage supplies to apply to the drain and control gate respectively of the memory element to be tested. The routing multiplexor 230 routes the current from the source side of the selected memory element. The drain voltage supplied by the external supply is nominally between 1 and 2 volts. The voltage applied to control gate by the external supply via the word line associated with the selected memory element is nominally between 0 and 5 volts. The threshold voltages may be characterized after the memory elements have been erased or programmed. Although the memory elements could be erased and characterized individually, the erase operation nominally takes a few hundred milliseconds and characterizing a memory element takes less than a microsecond. Thus, there is little difference in the time it takes to characterize selected memory elements and all of the memory elements in the virtual ground array. In general, the memory elements are erased in blocks, which saves a large amount of time.

One method of characterizing a selected memory element is to develop an I–V curve or a complete set of I–V curves for the memory element. In essence, emulation of the memory element under normal operating conditions may be accomplished. Another method of characterization is to determine only the threshold voltage necessary to turn on the memory element. As all three terminals of the memory element are under independent external control, either of these methods of characterization may be accomplished in a variety of ways. One method includes holding the voltage applied to the drain constant while changing the voltage applied to the control gate and observing the current from the source. Another method includes holding the voltage applied to the control gate constant while changing the voltage applied to the drain and observing the current from the source. Of course, valid methods could include any combination of changing applied voltages thereof. These methods are the same no matter whether the memory elements have been erased or programmed, only the voltages applied externally differ.

More specifically, to characterize a selected memory element by observing the source current, the drain-input multiplexor 231 and gate-input multiplexor 232 must select externally controlled voltage supplies. Once the voltage supply origins are under external control, a memory element is selected. The memory element is determined by selecting both a set of select gate lines (i.e. select gates) and a word line. Voltages are applied to the gate and drain of the selected memory element, the routing multiplexor 230 is adjusted to route the current of the selected memory element to the I/O pad 260, and the current is then determined. This procedure continues by changing the desired voltage(s) until the threshold voltage has been determined or the I–V curve (or set of I–V curves) attained for the selected memory element. A new memory element is selected and subsequently characterized. This process continues until the last desired memory element is characterized.

As an example, one possible method to determine the threshold voltage of erased memory element 352, select gate lines SG0 (select gate 341) and SG1 (select gate 344) are activated. The global bitlines 320, 322 associated with the select gates 341, 344 are respectively connected with the drain and source of the memory element 352. One of the global bitlines 320 sets voltage of the drain, and a voltage is applied along the associated word line 310 to the control gate of the memory element 352. I–V curves are then developed for the memory element 352. Alternately, the voltage initially applied to the control gate can either activate the memory element and incrementally change the voltage toward deactivation or initially not activate the memory element and incrementally change the voltage toward activation. As before, over time the threshold voltage of the memory element will increase from the initial value, correspondingly, the minimum voltage necessary to activate the memory element will increase. In addition, as stated, the same types of characteristics can be determined for programmed memory elements, the only difference being the change in the voltages applied to the control gate and/or drain of the memory elements. In this manner, not only can the threshold voltage and/or I–V curves of memory elements in the virtual ground array be determined, but the effects of placement of memory elements and the overall distribution of the threshold voltage/variation in threshold voltage can be attained.

Thus, in the preferred embodiments of the invention, a method and apparatus for characterizing memory elements in a virtual ground array using the source of a specific memory element are described. Select gates lines choose select gates that, in turn, select a group of memory elements. The memory elements in the virtual ground array are disposed in series along word lines and connected by local bitlines with the select gates. Both the select gates and a particular word line are used to select a specific memory element or a set of memory elements. Global bitlines, which connect the select gates with the elements external to the virtual ground array, are then used to apply a set voltage to the drain of the memory element and the desired characteristic is determined from the source. At least one multiplexor and column decoder select the current from one of the set of memory elements. A data buffer may be connected between the virtual ground array and the I/O pad to buffer the output of the virtual ground array. The desired characteristic is determined by external elements from data at the I/O pad. Threshold voltages as well as complete I–V characteristics can be acquired for some or all of the memory elements contained in the virtual ground array. In addition to providing a necessary means of characterization, both power consumption and processor time are saved by using the characterization method and apparatus embodied in the present invention.

While the invention has been described with reference to specific embodiments, the description is illustrative of the invention and not to be construed as limiting the invention. Various modifications and applications may occur to those skilled in the art without departing from the true spirit and scope of the invention as defined in the appended claims.

We claim:

1. A method of characterizing non-volatile memory elements in a
   virtual ground array from the source side comprising:
   selecting a set of memory elements contained in the virtual ground array;
   externally controlling a voltage of at least one of a gate, source, and drain of at least one selected memory element in the set of selected memory elements; and
   determining a current from the source of the selected memory element.

2. The method of claim 1 further comprising providing an operational element adapted to pass externally controlled, near ground, voltages to the selected memory element.

3. The method of claim 2, wherein controlling comprises controlling the voltages applied to the gate and the drain of the selected memory element.

4. The method of claim 3, wherein determining further comprises:
   changing the voltage applied to the gate of the selected memory element incrementally toward a predetermined voltage while holding the voltage applied to the drain of the selected memory element constant until the predetermined voltage is applied to the gate of the memory element; and
   ascertaining the current from the source of the selected memory element after every incremental change in the voltage applied to the gate, thereby creating an I–V curve for the selected memory element.

5. The method of claim 4, further comprising repeating creating an I–V curve for all of the memory elements in the set of selected memory elements.

6. The method of claim 3, wherein determining further comprises:
changing the voltage applied to the drain of the selected memory element incrementally toward a predetermined voltage while holding the voltage applied to the gate of the selected memory element constant until the predetermined voltage is applied to the drain of the memory element; and
ascertaining the current from the source of the selected memory element after every incremental change in the voltage applied to the drain, thereby creating an I–V curve for the selected memory element.

7. The method of claim 6 further comprising repeating creating an I–V curve for all of the memory elements in the set of selected memory elements.

8. The method of claim 1 further comprising creating an I–V curve for the memory element.

9. A method of characterizing non-volatile memory elements in a virtual ground array from the source side comprising:
selecting a memory element of a plurality of memory elements contained in the virtual ground array;
erasing the selected memory element;
externally controlling a gate voltage of a gate and a drain voltage of a drain of the selected memory element; and
determining a current from a source of the selected memory element.

10. The method of claim 9, wherein determining further comprises changing the gate voltage incrementally toward a predetermined voltage while holding the drain voltage constant until the predetermined voltage is applied.

11. The method of claim 10 further comprising repeating determining for all of the memory elements in a predetermined set of selected memory elements.

12. The method of claim 11 further comprising providing an operational element adapted to pass externally controlled, near ground, voltages to the selected memory element.

13. The method of claim 9, wherein determining further comprises changing the drain voltage incrementally toward a predetermined voltage while holding the gate voltage constant until the predetermined voltage is applied.

14. The method of claim 13 further comprising repeating determining for all of the memory elements in a predetermined set of selected memory elements.

15. The method of claim 14 further comprising providing an operational element adapted to pass externally controlled, near ground, voltages to the selected memory element.

16. An apparatus for characterizing non-volatile memory elements in a virtual ground array from the source side, the apparatus mcomprising:
a virtual ground array containing memory elements, each of the memory elements having a gate selectable by a word line of a plurality of word lines, a source selectableby a first bitline of a plurality of bitlines, and a drain selectable by a second bitline of the plurality of bitlines;
at least one source multiplexor, each source multiplexor operatively connected with the source of one of at least one selected memory element contained in the virtual ground array and multiplexing between the source and one of internal sense circuitry and an I/O pad, the I/O pad in communication with external sense circuitry;
at least one word line multiplexor, each word line multiplexor operatively connected with the gate of one of at least one memory element contained in the virtual ground array and multiplexing between the word line and one of an internal gate voltage generator and an external gate controller;
at least one drain multiplexor, each drain multiplexor operatively connected with the drain of one of at least one selected memory element contained in the virtual ground array and multiplexing between the drain and one of an internal drain voltage generator and an external drain controller; and
at least one operational element adapted to pass externally controlled near ground voltages to the selected memory element;
wherein the drain and the gate of the selected memory element is externally controlled, and a current is determined from the source of the selected memory element.

17. The apparatus of claim 16 further comprising:
an external gate controller adapted to supply a gate voltage to the gate of the selected memory element; and
an external drain controller adapted to supply a drain voltage to the drain of the selected memory element.

18. The apparatus of claim 17, wherein:
the gate voltage is incrementally changed toward a predetermined voltage and the drain voltage is held constant until the predetermined voltage is applied; and
the current from the source of the selected memory element is determined after each incremental change, thereby creating an I–V curve for the memory element.

19. The apparatus of claim 18 wherein the I–V curve is determined for all of a predetermined set of memory elements in the virtual ground array.

20. The apparatus of claim 17, wherein:
the drain voltage is incrementally changed toward a predetermined voltage and the gate voltage is held constant until the predetermined voltage is applied; and
the current from the source of the selected memory element is determined after each incremental change, thereby creating an I–V curve for the memory element.

21. The apparatus of claim 20 wherein the I–V curve is determined for all of a predetermined set of memory elements in the virtual ground array.

22. The apparatus of claim 16, the virtual ground array further comprising:
select gates selectable by select gate lines;
local bitlines connecting the select gates with the memory elements; and
global bitlines connecting the select gates with elements external to the virtual ground array;
wherein the memory elements are selectable by word lines and at least two of the select gates.

23. The apparatus of claim 22, wherein the local bitlines are formed by a diffusion process and the global bitlines are composed of metal.

24. The apparatus of claim 22, wherein:
the memory elements disposed along each word line are arranged in series along the word line; and
the virtual ground array is arranged such that a first set of pairs of select gates are connected with a first set of pairs of memory elements, a second set of pairs of select gates are connected with a second set of pairs of memory elements, and the first set of pairs of memory elements and second set of pairs of memory elements partially overlap each other.

25. The arrangement of claim 22, further comprising:

at least one multiplexor connected with the virtual ground array and both the source and drain multiplexors operative to select one memory element of a set of selected memory elements in the virtual ground array such that the drain of the selected memory element is input to the drain multiplexor and the source of the selected memory element is input to the source multiplexor, each multiplexor containing at least one operational element; and at least one column decoder connected with the virtual ground array and the word line multiplexor operative to select one memory element of a set of selected memory elements in the virtual ground array such that the word line of the selected memory element is input to the word line multiplexor.

26. An apparatus for characterizing non-volatile memory elements in a virtual ground array from the source side, the apparatus comprising:

a virtual ground array containing memory elements, each of the memory elements having a gate selectable by a word line of a plurality of word lines, a source selectable by a first bitline of a plurality of bitlines, and a drain selectable by a second bitline of the plurality of bitlines;

at least one source multiplexor, each source multiplexor operatively connected with the source of one of at least one selected memory element contained in the virtual ground array and multiplexing between the source and one of internal sense circuitry and an I/O pad, the I/O pad in communication with external sense circuitry;

at least one word line multiplexor, each word line multiplexor operatively connected with the gate of one of at least one memory element contained in the virtual ground array and multiplexing between the word line and one of an internal gate voltage generator and an external gate controller;

at least one drain multiplexor, each drain multiplexor operatively connected with the drain of one of at least one selected memory element contained in the virtual ground array and multiplexing between the drain and one of an internal drain voltage generator and an external drain controller;

a gate controller operative to externally control a gate voltage of the selected memory element;

a drain controller operative to externally control a drain voltage of the selected memory element; and at least one operational element adapted to pass externally controlled near ground voltages to the selected memory element;

wherein a current of the selected memory element is determined from the source of the selected memory element.

27. The apparatus of claim 26, wherein:

the gate voltage is incrementally changed toward a predetermined voltage and the drain voltage is held constant until the predetermined voltage is applied; and the current from the source of the selected memory element is determined after each incremental change, thereby creating an I–V curve for the memory element.

28. The apparatus of claim 27 wherein the I–V curve is determined for all of a predetermined set of memory elements in the virtual ground array.

29. The apparatus of claim 26, wherein:

the darin voltage is incrementally changed toward a predetermined voltage and the gate voltage is held constant until the predetermined voltage is applied; and the current from the source of the selected memory element is determined after each incremental change, thereby creating an I–V curve for the memory element.

30. The apparatus of claim 29 wherein the I–V curve is determined for all of a predetermined set of memory elements in the virtual ground array.

31. The apparatus of claim 26, the virtual ground array further comprising:

select gates selectable by select gate lines;

local bitlines connecting the select gates with the memory elements; and global bitlines connecting the select gates with elements external to the virtual ground array;

wherein the memory elements are selectable by word lines and at least two of the select gates.

32. The apparatus of claim 31, wherein the local bitlines are formed by a diffusion process and the global bitlines are composed of metal.

33. The apparatus of claim 32, wherein:

the memory elements disposed along each word line are arranged in series along the word line; and the virtual ground array is arranged such that a first set of pairs of select gates are connected with a first set of pairs of memory elements, a second set of pairs of select gates are connected with a second set of pairs of memory elements, and the first set of pairs of memory elements and second set of pairs of memory elements partially overlap each other.

34. The arrangement of claim 33, further comprising:

at least one multiplexor connected with the virtual ground array and both the source and drain multiplexors operative to select one memory element of a set of selected memory elements in the virtual ground array such that the drain of the selected memory element is input to the drain multiplexor and the source of the selected memory element is input to the source multiplexor each multiplexor containing at least one operational element; and at least one column decoder connected with the virtual ground array and the word line multiplexor operative to select one memory element of a set of selected memory elements in the virtual ground array such that the word line of the selected memory element is input to the word line multiplexor.

* * * * *